United States Patent [19]
Kushida

[11] Patent Number: 6,034,398
[45] Date of Patent: Mar. 7, 2000

[54] SEMICONDUCTOR DEVICE AND MANUFACTURING METHOD OF THE SAME

[75] Inventor: Tomoyoshi Kushida, Seto, Japan

[73] Assignee: Toyota Jidosha Kabushiki Kaisha, Toyota, Japan

[21] Appl. No.: 09/013,053

[22] Filed: Jan. 26, 1998

Related U.S. Application Data

[62] Division of application No. 08/735,455, Oct. 23, 1996, Pat. No. 5,750,429.

[30] Foreign Application Priority Data

Oct. 23, 1995 [JP] Japan .................................. 7-274389

[51] Int. Cl.[7] ........................................................ H01L 29/76
[52] U.S. Cl. ........................ 257/335; 257/339; 257/341; 257/342
[58] Field of Search .................................. 257/335, 339, 257/341, 342

[56] References Cited

U.S. PATENT DOCUMENTS

| | | | |
|---|---|---|---|
| 4,443,931 | 4/1984 | Baliga et al. | 29/571 |
| 4,587,713 | 5/1986 | Goodman et al. | 29/576 B |
| 4,777,149 | 10/1988 | Tanabe et al. | 438/268 |
| 4,810,665 | 3/1989 | Chang et al. | 437/30 |
| 4,837,606 | 6/1989 | Goodman et al. | 257/139 |
| 4,952,991 | 8/1990 | Kayama | 257/335 |
| 5,171,705 | 12/1992 | Choy | 148/DIG. 126 |
| 5,179,032 | 1/1993 | Quigg | 438/268 |
| 5,234,851 | 8/1993 | Korman et al. | 438/268 |
| 5,306,654 | 4/1994 | Kometani | 438/268 |
| 5,341,011 | 8/1994 | Hshieh et al. | 257/330 |
| 5,342,797 | 8/1994 | Sapp et al. | 438/268 |
| 5,369,045 | 11/1994 | Ng et al. | 148/DIG. 126 |
| 5,416,354 | 5/1995 | Blackstone | 257/499 |
| 5,508,217 | 4/1996 | Sawada | 438/268 |
| 5,528,063 | 6/1996 | Blanchard | 257/335 |
| 5,529,940 | 6/1996 | Yamamoto et al. | 438/268 |
| 5,631,484 | 5/1997 | Tsoi et al. | 257/341 |

*Primary Examiner*—Mahshid Saadat
*Assistant Examiner*—George C. Eckert, II
*Attorney, Agent, or Firm*—Pillsbury Madison & Sutro LLP

[57] ABSTRACT

In a semiconductor device of the insulated gate type, a side wall silicon oxide layer of a desired width is formed on each side wall of a gate electrode and a silicon oxide layer to reduce a distance between the contact end of a source electrode with an $N^+$-type source region and the internal end of the gate electrode thereby to decrease the on-resistance even if the impurity concentration of the $N^+$-type is determined to be low. Since the impurity concentration of the $N^+$-type source region is lower than that of a $P^+$-type body region and higher than the surface impurity concentration of a P-type body region, the base width of a parasitic bipolar transistor related to the P-type body region is maintained in a proper value without increasing the depth of the $N^+$-type source region in excess.

3 Claims, 9 Drawing Sheets

SEMICONDUCTOR DEVICE AND MANUFACTURING METHOD OF THE SAME

This is a division of Application Ser. No. 08/735,455 filed Oct. 23, 1996, now U.S. Pat. No. 5,750,429.

BACKGROUND OF THE INVENTION

1. Field of the Invention

The present invention relates to a semiconductor device, and more particularly to a semiconductor device of the insulated gate type and a manufacturing method of the same.

2. Description of the Prior Art

Illustrated in FIG. 6 is a vertical MOS field effect transistor as an example of a conventional semiconductor device of the insulated gate type, which comprises a semiconductor substrate 1 comprised of a drift region in the form of an N-type epitaxially grown layer 1b formed on a drain region in the form of an N$^+$-type semiconductor layer 1a, a gate oxide layer 2 partially formed on the main surface of the semiconductor substrate 1, a gate electrode 3 partially formed on the gate oxide layer 2 and an oxide layer 4 formed to cover the gate electrode 3. The vertical Mos field effect transistor is provided with a P-type body region 5 formed by implanting impurities of the P-type into the N-type epitaxially grown layer 1b from the main surface side of the substrate 1 and being spreaded beneath the gate electrode 3, an N$^+$-type source region 6 formed by implanting impurities of the P-type in a portion of the P-type body region 5, a P$^+$-type body region 7 of approximately the same depth as that of the P-type body region 5 formed by implanting impurities of the P-type in a portion of the N$^+$-type source region 6, a source electrode 8 commonly in contact with the N$^+$-type source region 6 and P$^+$-type body region 7 at the main surface side of the substrate 1 and a drain electrode 9 formed on the back surface of the substrate 1. Illustrated in FIG. 7 is distribution of impurity concentration in a section taken along line VII—VII in FIG. 6. As shown in FIG. 7, the concentration of the N$^+$-type source region in the MOS field effect transistor is determined to be higher than that of the P$^+$-type body region 7. The reference character NA in FIG. 7 represents an inert impurity concentration.

Illustrated in FIGS. 8(a)–8(i) is a manufacturing process of the conventional vertical MOS field effect transistor. As shown in FIG. 8(a), a drift region in the form of an N-type epitaxial layer 1b is grown on a drain region in the form of an N$^+$-type semiconductor layer 1a to provide a semiconductor substrate 1, and a gate oxide layer 2 is formed on the surface of the N-type epitaxial layer 1b. At the following step, a poly-silicon gate electrode 3 containing phosphorus is formed on the gate oxide layer 2 and provided thereon with a first photo-resist layer 3a. As shown in FIG. 8(c), the gate electrode 3 is formed by partly eliminating the photo-resist layer 3a and etching the poly-silicon using the photo-resist layer 3a as a mask. After the photo-resist layer 3a is eliminated, as shown in FIG. 8(d), boron ions B are implanted into the N-type epitaxial layer 1b by using the gate electrode 3 as a mask to form a P-type body region 5 spread beneath the gate electrode 3 by thermal diffusion. Subsequently, as shown in FIG. 8(e), a second photo-resist layer 3b is formed on the gate electrode 3 and P-type body region 5 in such a manner as to expose a portion of the P-type body region 5, and boron ions B are implanted at high concentration by using the photo-resist layer 3b as a mask to form a P$^+$-type body region 7 with the depth of the P-type body region 5 by thermal diffusion.

Thereafter, as shown in FIG. 8(f), a third photo-resist layer 3c is formed to cover the P$^+$-type body region 7, and arsenic ions As are implanted in the P-type body region 5 and P$^+$-type body region 7 by using the photo-resist layer 3c as a mask to form an N$^+$-type source region 6 of higher concentration than the P$^+$-type body region 7 by thermal diffusion. At the following step, as shown in FIG. 8(g), an oxide layer 4 containing phosphorus P is formed on the gate oxide layer 2 and gate electrode 3, and a fourth photo-resist layer (not shown) is formed on the oxide layer 4. Thus, as shown in FIG. 8(h), the oxide layer 4 is partly etched by using the photo-resist layer as a mask to expose the surface of the P$^+$-type source region 6. In such a condition, as shown in FIG. 8(i), a source electrode 8 commonly in contact with the N$^+$-type source region 6 and P$^+$-type body region 7 is formed on the oxide layer 4 at the main surface side of the substrate 1, and a drain electrode 9 is formed on the back surface of the substrate 1.

In the vertical MOS field effect transistor, as shown in FIG. 6, the on-resistance of the N$^+$-type source region 6 is determined by a distance L between each end of the source electrode 8 in contact with the N$^+$-type source region 6 and each internal side end of gate electrode 3 and oxide layer 4. However, the distance L may not be defined less than a sum of thickness $L_1$ of the internal insulating layer and the accuracy $L_2$ of the mask alignment of the photo resist layer. If the distance L is defined to be less than the sum of the thickness $L_1$ and accuracy $L_2$, an actual opening dimension $x_1$ of the oxide layer 4 is decreased to a dimension $x_2$ after etching the oxide layer 4 due to a positional deviation of the mask alignment. This causes an increase of the distance L, resulting in an increase of the on-resistance of the N$^+$-type source region 6. If the dimension for accuracy $L_2$ is determined to decrease the on-resistance of the N$^+$-type source region 6, it is required to increase the concentration of the N$^+$type source region 6.

In the case that the concentration of the N$^+$-type source region 6 is increased, the depth of the N$^+$-type source region increases, and the base width of a parasitic bipolar transistor related to the P-type body region 5 becomes narrow. As a result, punch-through voltage at the base portion is decreased to cause the occurrence of punch-through puncture. For the reasons described above, it is impossible to enhance the pressure resistance of the P-type body region 5 with reduction of the on-resistance of the N$^+$-type source region 6.

SUMMARY OF THE INVENTION

It is therefore, a primary object of the present invention to provide a semiconductor device of the insulated gate type and a manufacturing method of the same capable of decreasing the on-resistance of the source region and enhancing the pressure resistance of the P-type body region.

According to the present invention, the object is accomplished by providing a semiconductor device which comprises a semiconductor substrate of the first conductivity type or of the first conductivity type at a main surface side and the second conductivity type at a back surface side; a first insulating layer formed on a portion of the main surface of the semiconductor substrate; a first electrode formed on the first insulating layer at a predetermined position; a second insulating layer formed to cover the surface of the first electrode; a side wall insulating layer formed on side walls of the first electrode and the second insulating layer; a first conductive region formed by implanting impurities of the second conductivity type in the semiconductor substrate from the main surface side and being spread beneath the first electrode; a second conductive region formed by implanting impurities of the first conductivity type in the first conductive electrode and being spread beneath the first electrode, the second conductive region having a depth shallower than that of the first conductive region and a concentration higher than the surface concentration of the first conductive region; a third conductive region formed by implanting impurities of the second conductivity type in a portion of the second conductive region and having a concentration higher than that of the second conductive region; a second electrode formed at the main surface side of the substrate and being commonly in contact with the second and third conductive regions; and a third electrode formed on the back surface of the semiconductor substrate or in a position spaced from the first and second electrodes on the main surface of the semiconductor substrate.

According to an aspect of the present invention, there is provided a semiconductor device which comprises a semiconductor of the first conductivity type or of the first conductivity type at a main surface side and the second conductivity type at a back surface side; a groove portion formed in a region of the first conductivity type at the main surface side of the semiconductor substrate; a first insulating layer formed on the main surface of the substrate within the groove portion; a first electrode formed on the first insulating layer within the groove portion; a first electrode formed on the first insulating layer within the groove portion; a second insulation layer formed to cover the first electrode; a side wall insulating layer formed on a side wall of the second insulating layer; a first conductive region formed by implanting impurities of the second conductivity type in the semiconductor substrate from the main surface side; a second conductive region formed by implanting impurities of the first conductivity type in the first conductive region and having a depth shallower than that of the conductive region and a concentration higher than the surface concentration of the first conductive region; a third conductive region formed by implanting impurities of the second conductivity type in a portion of the second conductive region and having a concentration higher than that of the second conductive region; a second electrode formed at the main surface side of the semiconductor substrate and being commonly in contact with the second and third conductive regions; and a third electrode formed on the back surface of the semiconductor substrate or in a position spaced from the first and second electrodes on the main surface of the semiconductor substrate.

According to another aspect of the present invention, there is provided a manufacturing method of a semiconductor device which comprises the steps of forming a semiconductor substrate of the first conductivity type or of the first conductivity type at a main surface side and the second conductivity type at a back surface side; forming a groove portion in a region of the first conductive type at the main surface side of the semiconductor substrate; forming a first insulating layer on the main surface of the semiconductor substrate within the groove portion; forming a second insulating layer to cover the surface of the first electrode; implanting impurities of the second conductivity type in the semiconductor substrate from the main surface side to form a first conductive region; implanting impurities of the first conductivity type in the first conductive region to form a second conductive region having a depth shallower than the first conductive region and a concentration higher than the surface concentration of the first conductive region; forming a third insulating layer at the main surface of the semiconductor substrate; eliminating a portion of the third insulating layer by anisotropy etching in such a manner as to expose a portion of the second conductive region and to form a side wall insulating layer on a side wall of the second insulating layer; implanting impurities of the second conductivity type in the second conductive region to form a third conductive region having a concentration higher than that of the second conductive region; eliminating a portion of each side wall of the first electrode and the second insulating layer by isotropy etching to expose a portion of the second conductive region; forming a second electrode commonly in contact with the second and third conductive regions at the main surface side of the semiconductor substrate; and forming a third electrode on the back surface of the semiconductor substrate or in a position spaced from the first and second electrodes on the main surface of the semiconductor substrate.

BRIEF DESCRIPTION OF THE DRAWINGS

Other object, features and advantages of the present invention will be more readily appreciated from the following detailed description of preferred embodiments thereof when taken together with the accompanying drawings, in which.

DESCRIPTION OF THE PREFERRED EMBODIMENT

Figure 1:
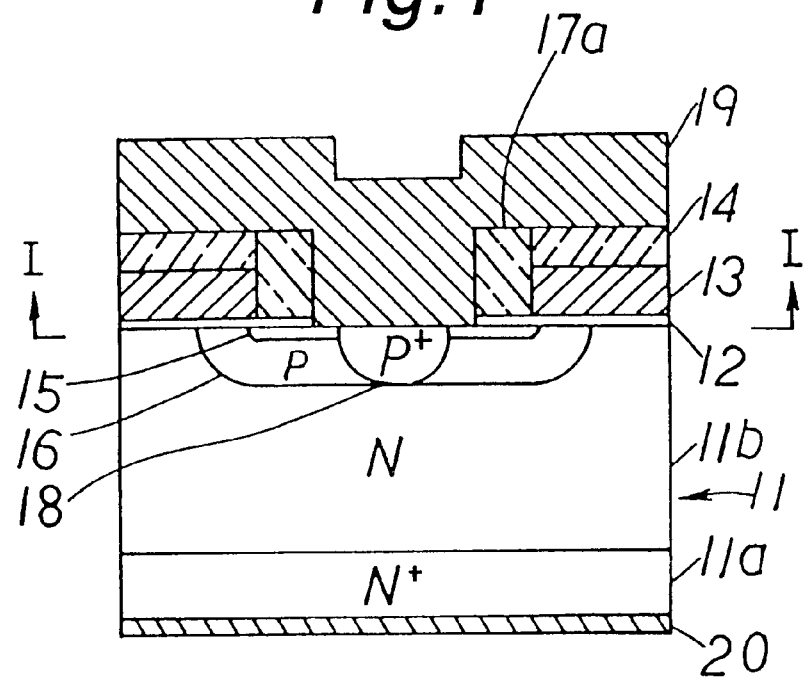
FIG. 1 is a sectional view of a vertical MOS field effect transistor of the gate insulated type in accordance with the present invention.

Illustrated in FIG. 1 of the drawings is a vertical MOS field transistor in accordance with the present invention. The vertical MOS field effect transistor comprises a silicon semiconductor substrate 11 comprised of a drift region in the form of an N-type epitaxially grown layer 11$b$ formed on a drain region in the form of an N$^+$-type silicon layer 11$a$, a gate oxide layer 12 formed on a portion of a main surface of the substrate 11, a gate electrode 13 partly formed on the gate oxide layer 12, a silicon insulating layer 14 formed to cover the gate electrode 13, a side wall silicon oxide layer 17$a$ formed on internal side walls of the gate electrode 13 and silicon insulating layer 14, a P-type body region 16 formed by implanting impurities of the P-type in the N-type epitaxially grown layer 11$b$ from the main surface side of the substrate 11 and being spread beneath the gate electrode 13, an N$^+$-type source region 15 formed by implanting impurities of the N-type in the P-type body region 16 and a P$^+$-type body region 18 of approximately the same depth as that of the P-type body region 16 formed by implanting impurities of the P-type in a portion of the N$^+$-type source region 15 from the main surface side of the substrate 11.

Figure 2:
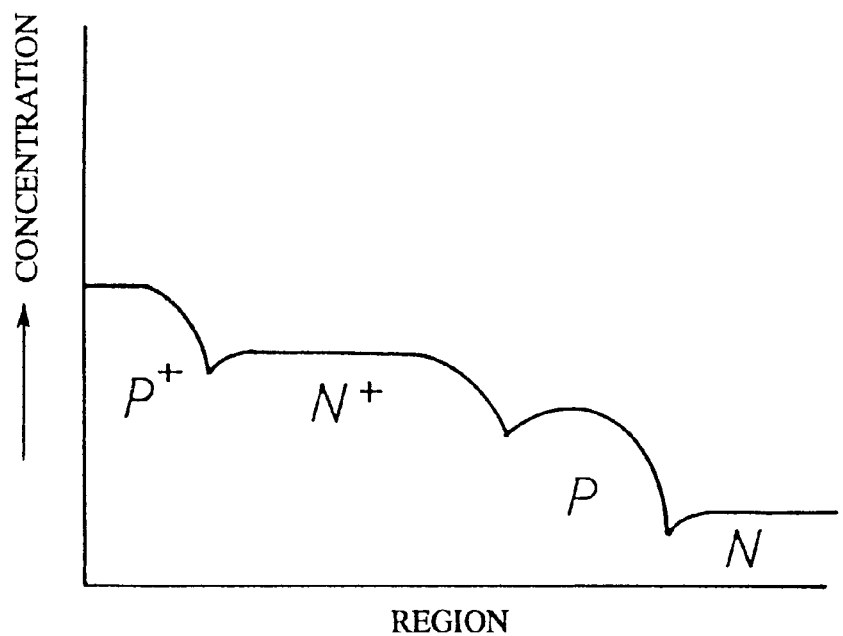
FIG. 2 is a graph illustrating distribution of impurity concentration at each region in a section taken along line I—I in FIG. 1.

The vertical MOS field effect transistor further comprises a source electrode 19 commonly in contact with the N⁺-type source region 15 and P⁺-type body region 18 at the main surface side of the substrate 11, and a drain electrode 20 formed on the back surface of the substrate 11. Illustrated in FIG. 2 is distribution of impurity concentration in a section taken along line I—I in FIG. 1. As shown in FIG. 2, the concentration of the N⁺-type source region 15 is determined to be lower than that of the P⁺-type body region 18 and to be about ten times the concentration of the P-type body section 16.

Figure 3A:
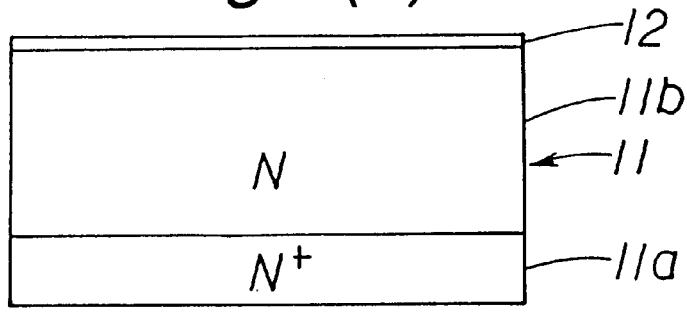
FIG. 3($a$)–3($i$) are sectional views illustrating the steps of manufacturing the vertical MOS field effect transistor shown in FIG. 1.
Figure 3B:
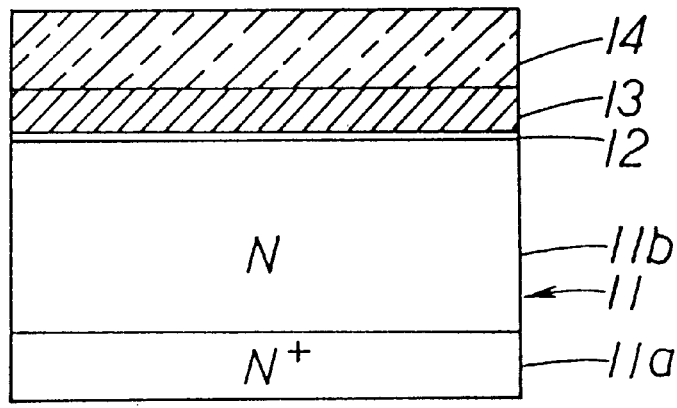
Figure 3C:
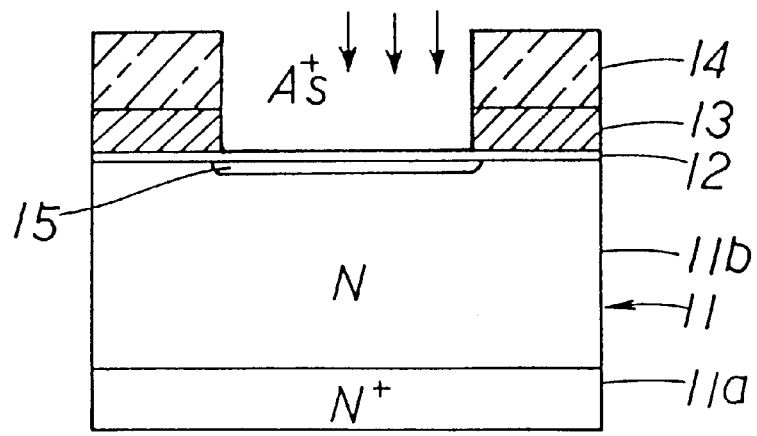
Figure 3D:
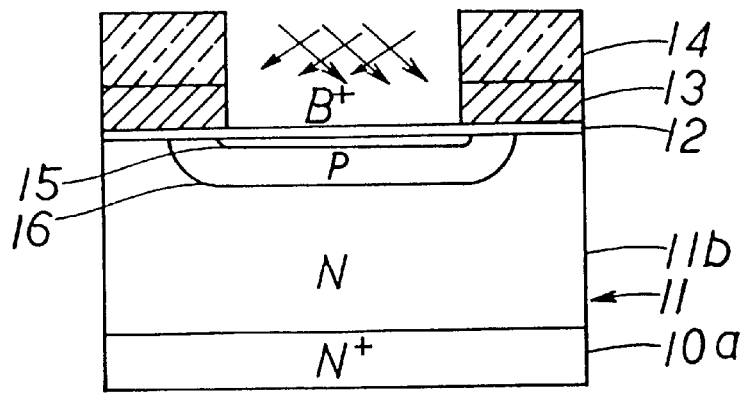
Figure 3E:
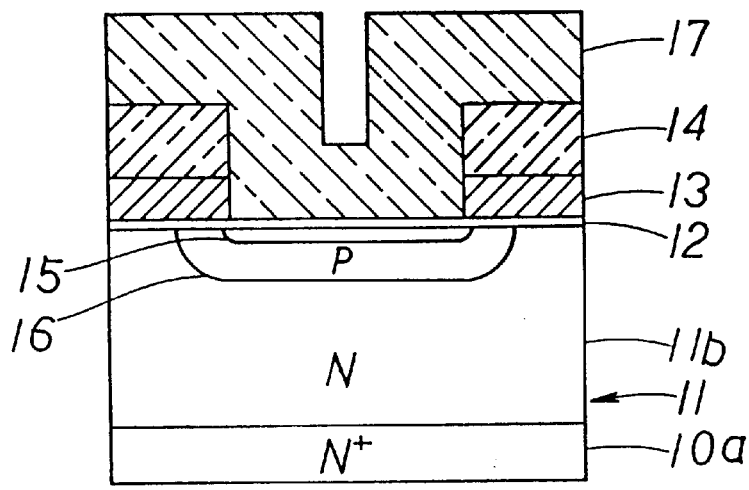
Figure 3F:
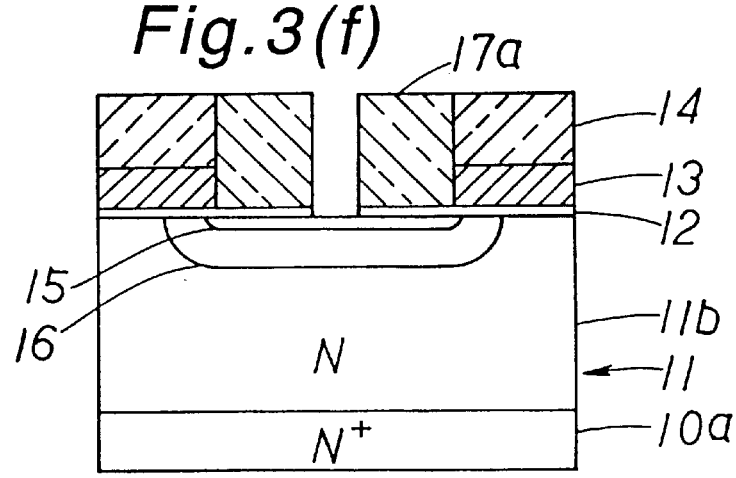

Illustrated in FIG. 3(a)–3(i) is a manufacturing process of the vertical MOS field effect transistor. As shown in FIG. 3(a), a gate oxide layer 12 is formed on the surface of the N-type epitaxial layer 11b during thermal oxidization of the silicon semiconductor substrate 11. When the pressure resistance is about 60 volt, the concentration is determined to be about $1 \times 10^{16} \text{cm}^{-3}$. At the following step, as shown in FIG. 3(b), a gate electrode 13 in the form of a poly-silicon layer containing phosphorous P is grown on the gate oxide layer 12 by a chemical vapor phase deposition method or CVD method, and subsequently a silicon oxide layer 14 is formed on the gate electrode 13. Thereafter, as shown in FIG. 3(c), the gate electrode 13 and silicon oxide layer 14 are partly eliminated by a photolithography technique and a reaction etching technique, and impurities of the third element such as arsenic ions As are implanted in the silicon semiconductor substrate 11 by using the gate electrode 13 as a mask to form an N⁺-type source region 15. At the following step, as shown in FIG. 3(d), impurities of the third element such as boron ions B are implanted in the substrate 11 by using the gate electrode 13 as a mask to form a P-type body region 16. In this instance, the impurities are implanted by an inclined rotary implanting method in such a manner that maximum concentration of the impurities is located in the center of a channel region beneath the gate oxide layer 12 or adjacent to the drift region. After the P-type body region 16 is formed, as shown in FIG. 3(e), a silicon oxide layer 17 containing phosphorous P is grown by the CVD method at the main surface side of the substrate 11, and as shown in FIG. 3(f), the silicon oxide layer 17 is partly eliminated by anisotropy etching in such a manner as to expose a portion of the N⁺-type source region 15 on the main surface side of the substrate 11 and to form a side wall oxide layer 17a on each side wall of the gate electrode 13 and silicon oxide layer 14. When the silicon surface of the N⁺-type source region 15 is exposed, the finish of etching is accurately determined by change of emitting strength of plasma.

Figure 3G:
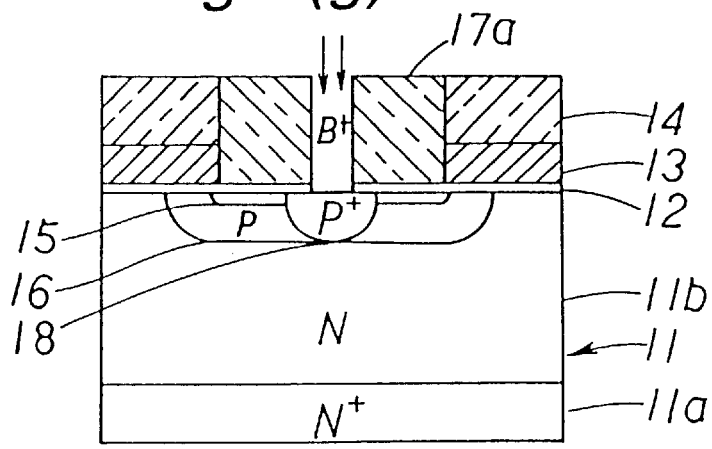
Figure 3H:
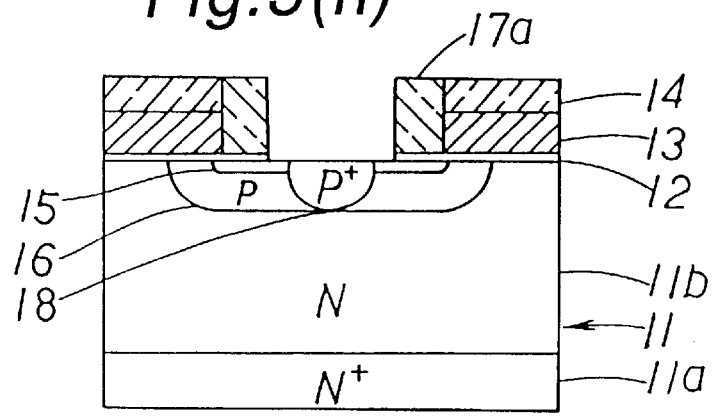
Figure 3I:
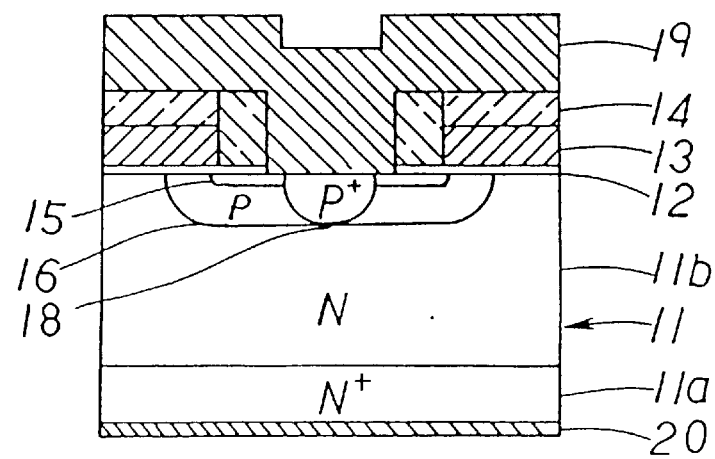

At the following step, as shown in FIG. 3(g), impurities of the third element such as boron ions B are implanted in the substrate 11 by using the side wall silicon oxide layer 17a as a mask to form a P⁺-type body region 18. Thereafter, low temperature thermal treatment(for instance, under 90° C. for thirty minutes) or high temperature short time thermal treatment(for instance, under 110° C. for thirty seconds) of the silicon semiconductor substrate 11 is carried out to activate the N⁺-type source region 15, P-type body region 16 and P⁺-type body region 18 without causing any thermal diffusion. In addition, as shown in FIG. 3(h), the silicon oxide layers 14 and 17a and the gate oxide layer 12 are partly eliminated by isotropy etching to expose a portion of the N⁺-type source region 15 and to form the side wall silicon oxide layer 17a in a desired width. At the following step, as shown in FIG. 3(i), metal such as aluminum is deposited on the main surface of the substrate 1 by spattering to form a source electrode commonly in contact with the N⁺-type source region 15 and P⁺-type body region 18, and a metal layer is deposited on the back surface of the substrate 11 to form a drain electrode 20.

Figure 7:
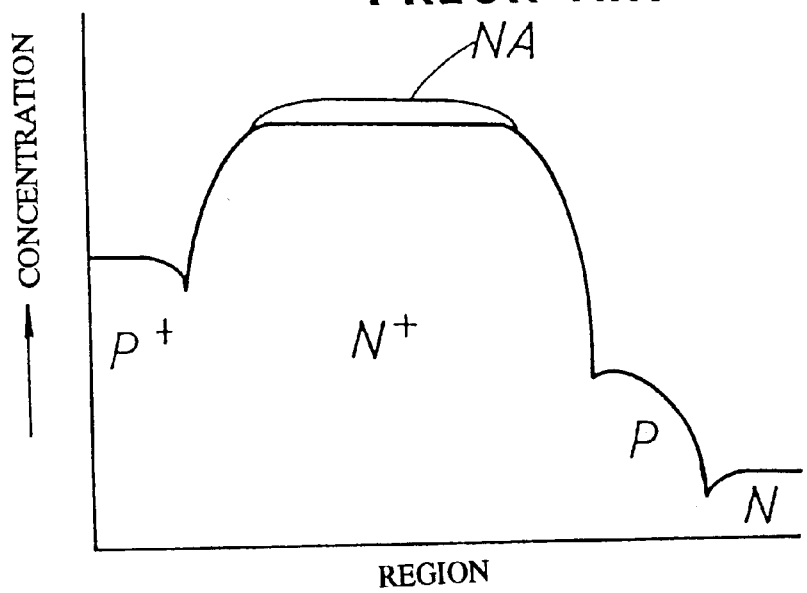
FIG. 7 is a graph illustrating distribution of impurity concentration at each region in a section taken along line VII—VII in FIG. 6.
Figure 8A:
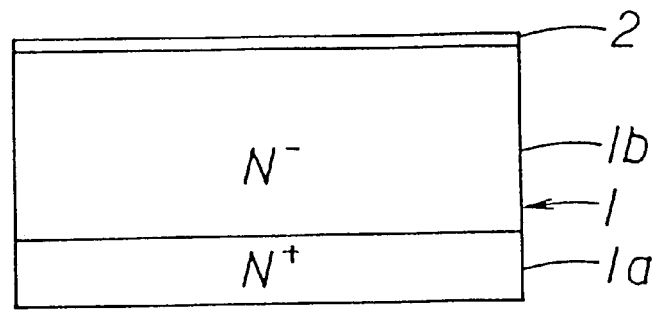
FIG. 8($a$)–8($i$) are sectional views illustrating the steps of manufacturing the conventional field effect transistor shown in FIG. 6
Figure 8B:
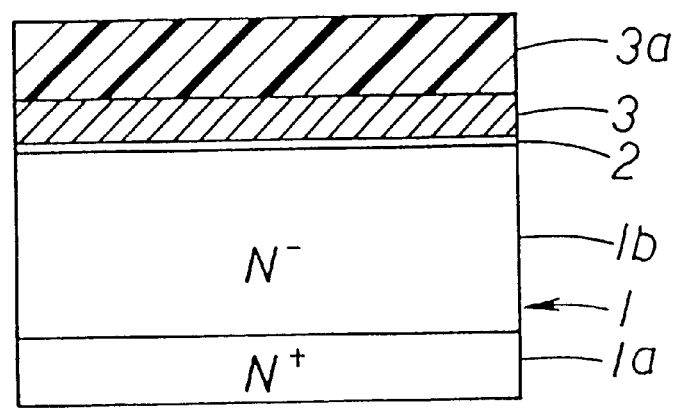
Figure 8C:
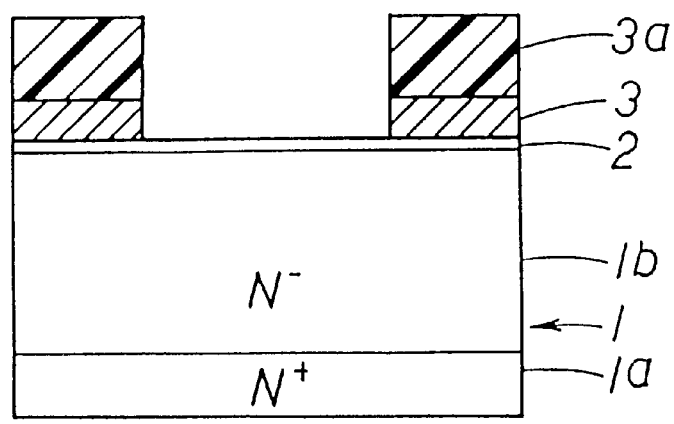
Figure 8D:
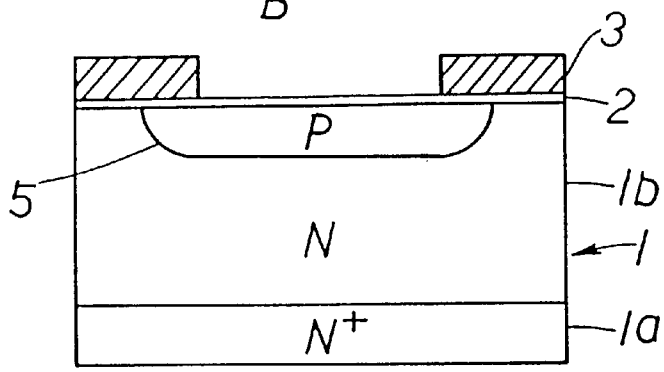
Figure 8E:
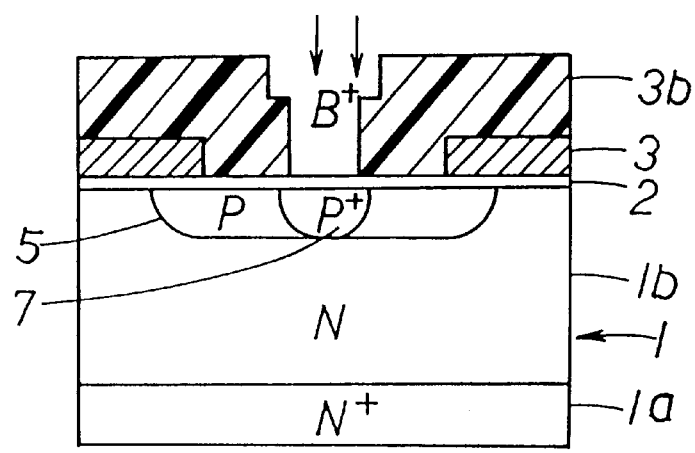
Figure 8F:
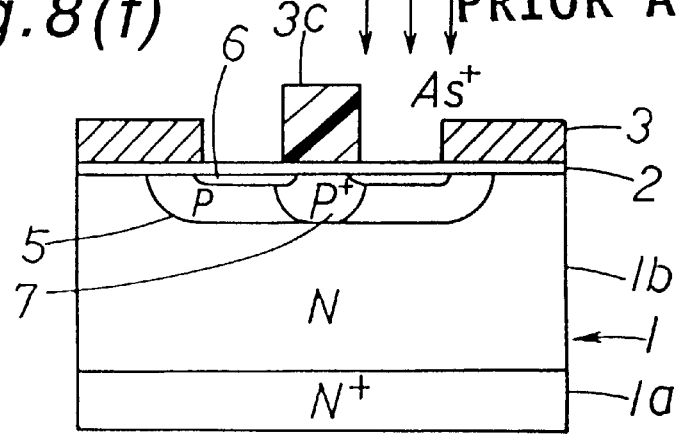
Figure 8G:
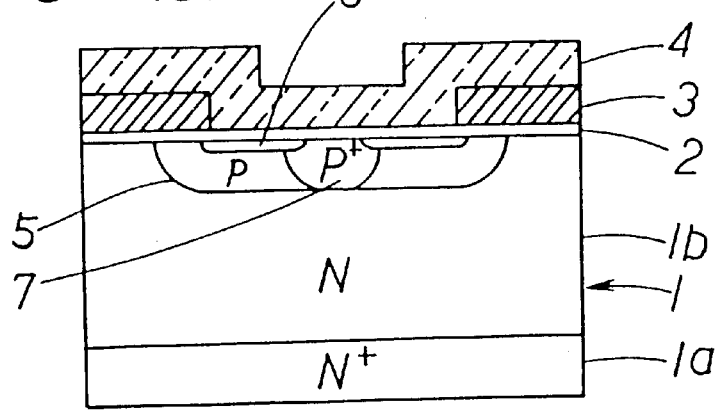
Figure 8H:
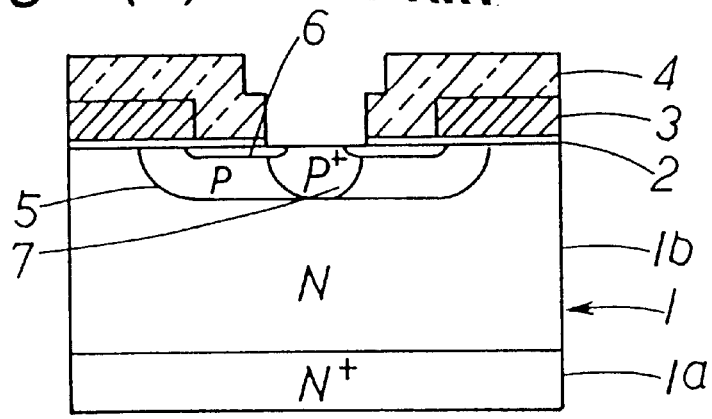
Figure 8I:
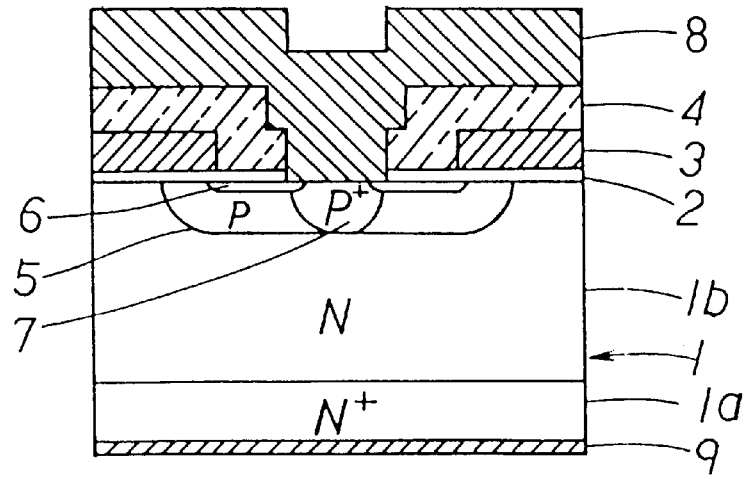

As is understood from the above description, the side wall silicon oxide layer 17a of the desired width on each side wall of the gate electrode 13 and silicon oxide layer 14 is useful to reduce the distance between the contact end of the source electrode 19 with the N⁺-type source region 15 and the internal end of gate electrode 13. This is effective to sufficiently decrease the on-resistance even if the impurity concentration of the N⁺-type source region 15 is determined to be low. Since the impurity concentration of the N⁺-type source region 15 is lower than that of P⁺-type body region 18 and higher than the surface impurity concentration of the P-type body region 16, the base width of a parasitic bipolar transistor related to the P-type body region 16 is maintained in a proper value without increasing the depth of the N⁺-type source region 15 in excess. Thus, the punch-through voltage and voltage resistance at the P-type body region 16 become high. Additionally, the inert impurity concentration NA shown in FIG. 7 can be eliminated since the concentration of the N⁺type source region 15 is decreased less than that of the P⁺-type body region 18. As a result, a leak current between the N⁺-type source region 15 and P-type body region 16 can be reduced to stabilize the operation of the vertical MOS field effect transistor.

During the manufacturing process of the vertical MOS field transistor, the P-type body region 16 and N⁺-type source region 15 can be formed without the photolithography step required in the conventional process since the impurities are implanted by using the gate electrode 13 as a common mask. The P⁺-type body region 18 can be formed without the photolithography step required in the conventional process since the impurities are implanted by using the side wall silicon oxide layer 17a as a mask. Furthermore, the source electrode 19 commonly in contact with the N⁺-type source region 15 and P⁺-type body region 18 can be provided without the photolithography step required in the conventional process since the silicon oxide layer 14, side wall silicon oxide layer 17a and gate oxide layer 12 are partly eliminated by isotropy etching. Thus, the manufacturing process is greatly shortened to produce the vertical MOS field effect transistor at a low cost. Since any accuracy at the photolithography step is not required for formation of the contact portion of the N⁺-type source region 15 with the source electrode 19, the chip area of the transistor can be decreased for reduction of the chip cost.

Figure 4:
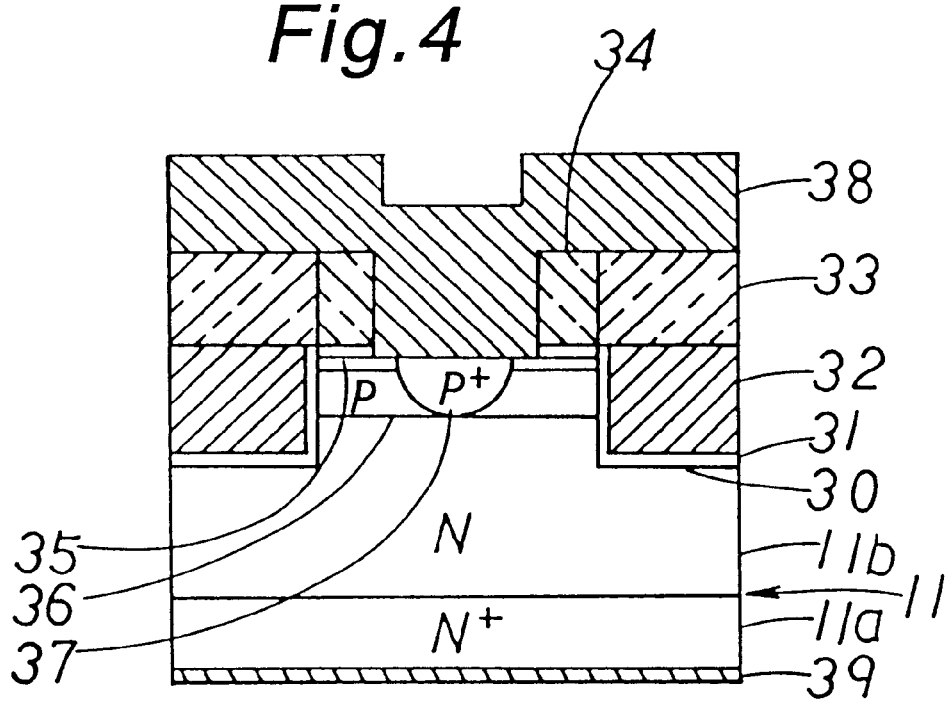
FIG. 4 is a sectional view of a modification of the vertical MOS field effect transistor shown in FIG. 1.

In FIG. 4, there is illustrated a modification of the vertical MOS field effect transistor, wherein a U-letter shaped groove portion 30 is formed in the N-type epitaxial layer lib at the main surface side of the substrate 11, and wherein a gate electrode 32 is embedded in the groove portion 30 after formed a gate oxide layer 31. The modified transistor is produced by the same manufacturing process as described above to form a silicon oxide layer 33, a side wall silicon oxide layer 34, an N⁺-type source region 35, a P-type body region 36, a P⁺-type body region 37, a source electrode 38 and a drain electrode 39.

Figure 5:
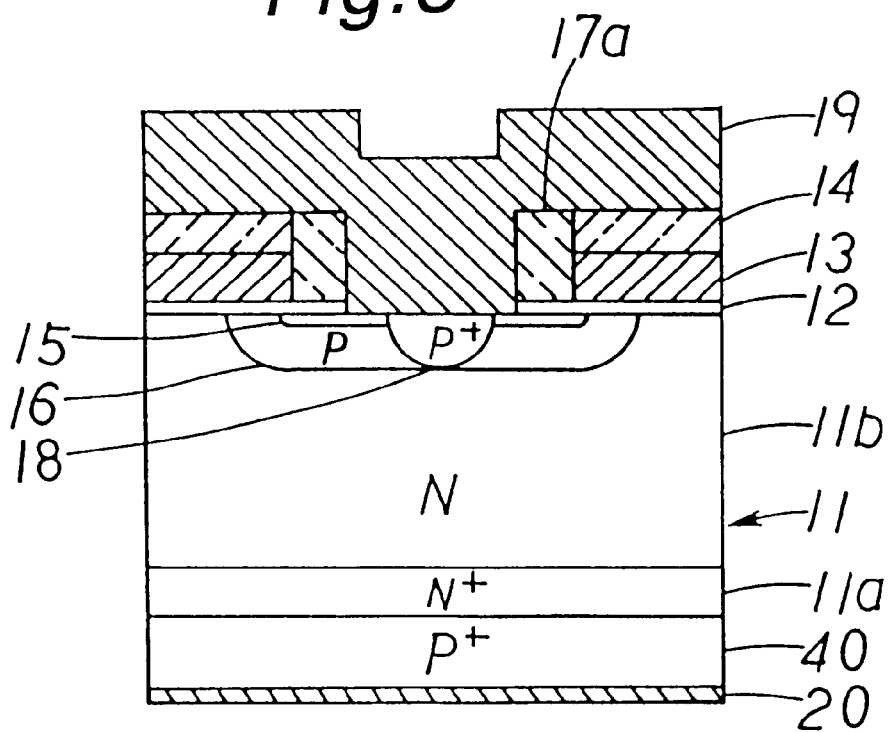
FIG. 5 is a sectional view of a bipolar transistor of the vertical insulated gate type.
Figure 6:
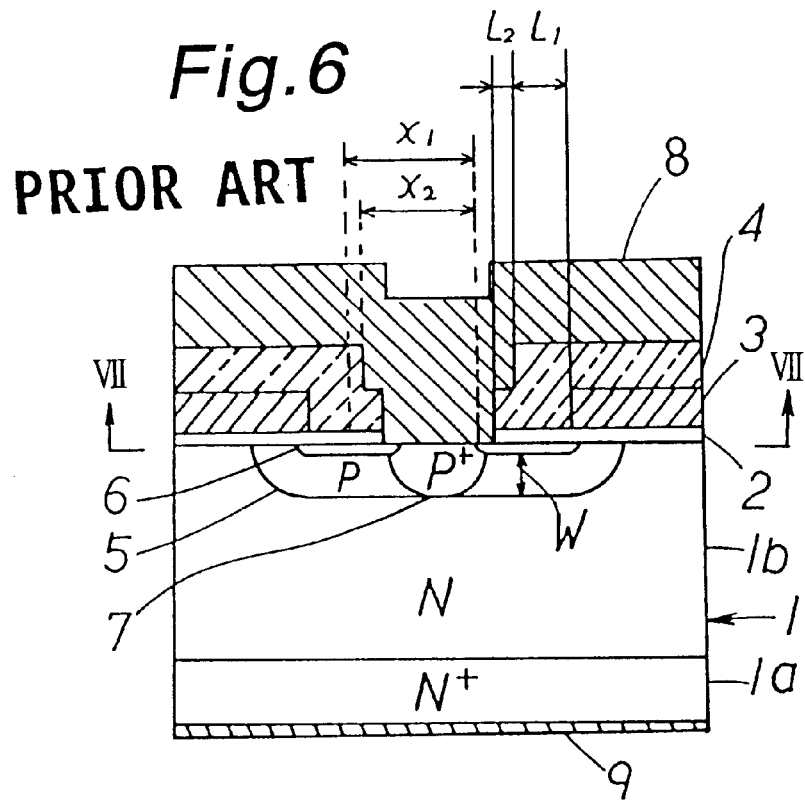
FIG. 6 is a sectional view of a conventional field effect transistor of the vertical insulated type.

In FIG. 5 there is illustrated a bipolar transistor of the vertical gate type which is provided at its back surface with a P⁺-type drain region. The other construction of the bipolar transistor is substantially the same as the vertical MOS field effect transistor shown in FIG. 1. The bipolar transistor can be produced by the manufacturing method described above to obtain the advantageous effects as in the vertical MOS field effect transistor. The bipolar transistor may be also modified as shown in FIG. 4.

Although in the above-described embodiment and modifications, the present invention has been adapted to a semiconductor device of the P-channel type, the present invention may be adapted to a semiconductor device of the N-channel type each region of which is reversed in polarity. As the material of the semiconductor, chemical semiconductor such as gallium may be used. The side wall silicon oxide layer may be replaced with a silicon nitrogen layer. The drain electrode may be provided in a position spaced from the source electrode and gate electrode.

What is claimed is:

1. A semiconductor device comprising:

a semiconductor substrate of a first conductivity type at a main surface side and a second conductive type at a back surface side;

a groove portion formed in the main surface of said semiconductor substrate;

a first insulating layer formed on the main surface of said substrate within said groove portion;

a first electrode formed on said first insulating layer within said groove portion;

a second insulating layer formed to cover said first electrode;

a side wall insulating layer formed on a side wall of said second insulating layer;

a first conductive region formed by implanting impurities of the second conductivity type in said semiconductor substrate from the main surface side;

a second conductive region formed by implanting impurities of the first conductivity type in said first conductive region and having a depth shallower than that of said first conductive region and a higher concentration than a surface concentration of said first conductive region;

a third conductive region formed by implanting impurities of the second conductivity type in a portion of said second conductive region and having a higher concentration than that of said second conductive region;

a second electrode formed at the main surface side of said semiconductor substrate and being commonly in contact with said second and third conductive regions; and a third electrode formed on the back surface side of said semiconductor substrate.

2. A semiconductor device as recited in claim 1, wherein the concentration of said second conductive region is about ten times the surface concentration of said first conductive region.

3. A semiconductor device comprising:

a semiconductor substrate of a first conductivity type at a main surface side and a second conductivity type at a back surface side;

a first insulating layer formed on a portion of the main surface of said semiconductor substrate;

a first electrode formed on said first insulating layer at a predetermined position;

a second insulating layer formed to cover the surface of said first electrode;

a side wall insulating layer formed on side walls of said first electrode and said second insulating layer;

a first conductive region formed by implanting impurities of the second conductive type in said semiconductor substrate from the main surface side and being spread beneath said first electrode;

a second conductive region formed by implanting impurities of the first conductivity type in said first conductive region and being spread beneath said first electrode, said second conductive region having a depth shallower than that of said first conductive region and a higher concentration than a surface concentration of said first conductive region;

a third conductive region formed by implanting impurities of the second conductivity type in a portion of said second conductive region and having a higher concentration than that of said second conductive region;

a second electrode formed at the main surface side of said substrate and being commonly in contact with said second and third conductive regions; and a third electrode formed on the back surface side of said semiconductor substrate;

wherein the concentration of said second conductive region is about ten times the surface concentration of said first conductive region.

* * * * *